United States Patent [19]
Smith

[11] Patent Number: 5,097,403
[45] Date of Patent: Mar. 17, 1992

[54] CURRENT SENSING SYNCHRONOUS RECTIFIER APPARATUS

[75] Inventor: David A. Smith, Kowloon, Hong Kong

[73] Assignee: Astec International Ltd., Rep. of Korea

[21] Appl. No.: 653,776

[22] Filed: Feb. 11, 1991

[51] Int. Cl.$^5$ .......................................... H02M 7/217
[52] U.S. Cl. ...................................... 363/127; 330/51
[58] Field of Search ........................ 363/76, 77, 127; 330/297, 91

[56] References Cited

U.S. PATENT DOCUMENTS 4,543,534  9/1985  Seki et al. ............................. 330/297
4,654,568  3/1987  Monsmann ............................ 318/293

Primary Examiner—Steven L. Stephan
Assistant Examiner—Ben Davidson
Attorney, Agent, or Firm—McCubbery, Bartels, Meyer & Ward

[57] ABSTRACT

A current-sensing rectifier for current rectification and measurement applications is described. The current-sensing rectifier comprises a current-sensing device for rectifying the current in a selected circuit branch and an active-sense comparison circuit to measure the sense current provided by the current-sensing device. The current-sensing device and active measurement circuit are operated such that the current-sensing device rectifies the current of a selected circuit branch. No negative voltage supplies are required for rectification or for the measurement of the branch current. Further embodiments of the present invention include sample-and-hold circuits which sample the value of the rectified current during an ON-period of operation and maintain the sampled value during a subsequent OFF-period.

27 Claims, 7 Drawing Sheets

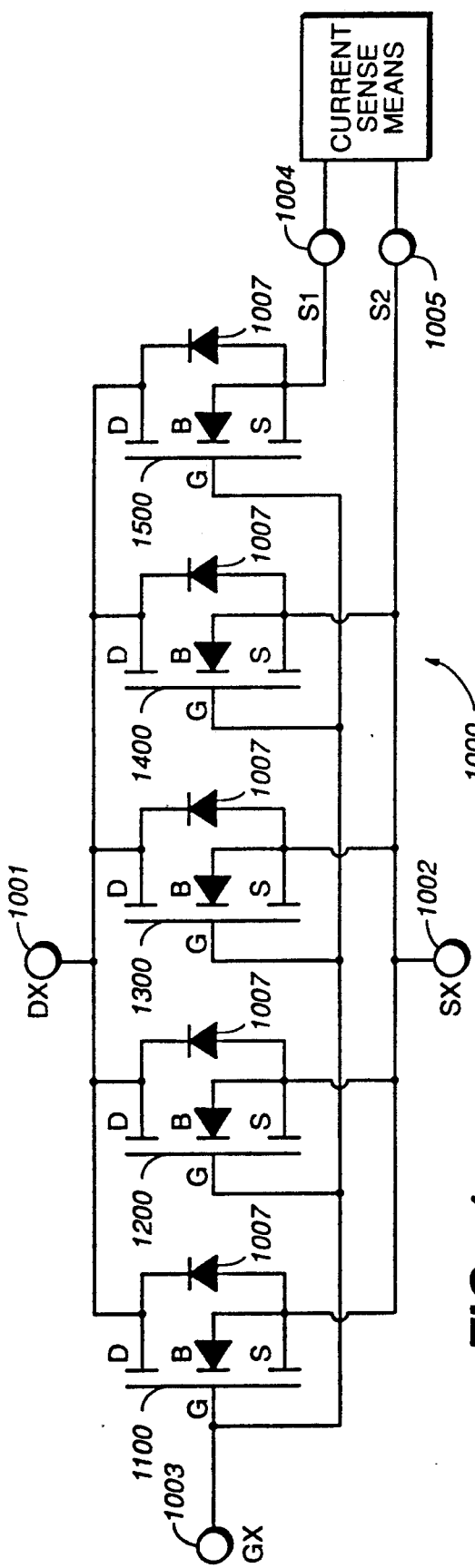
FIG._1
(PRIOR ART)
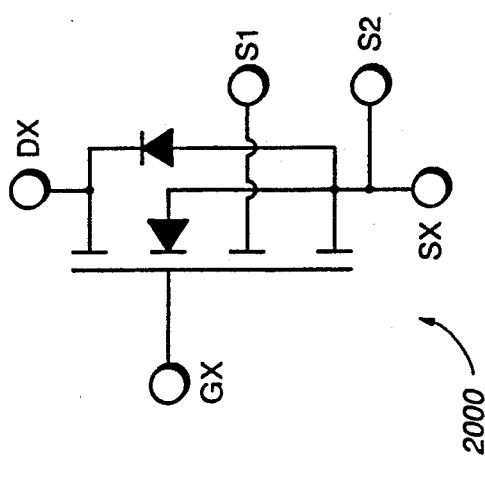
FIG._2
(PRIOR ART)

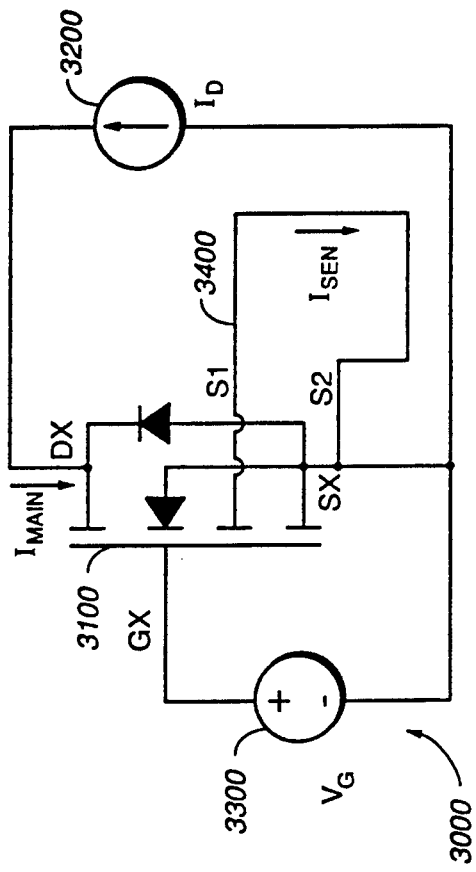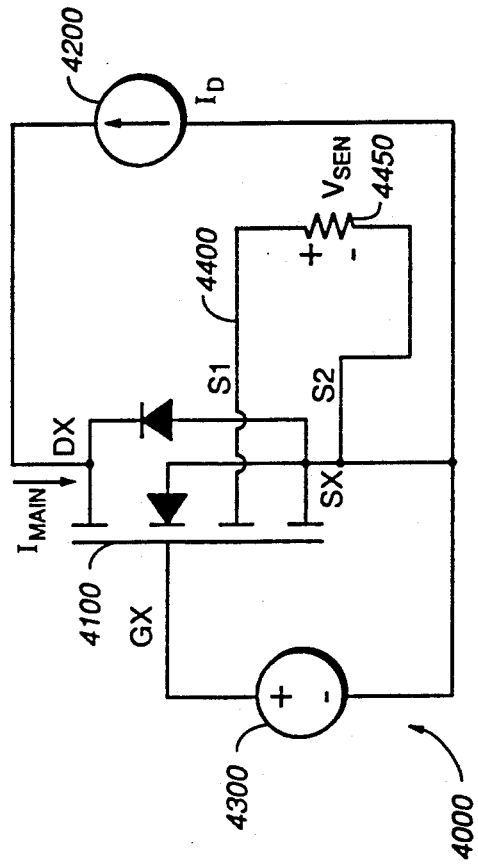
FIG._3
(PRIOR ART)
FIG._4
(PRIOR ART)

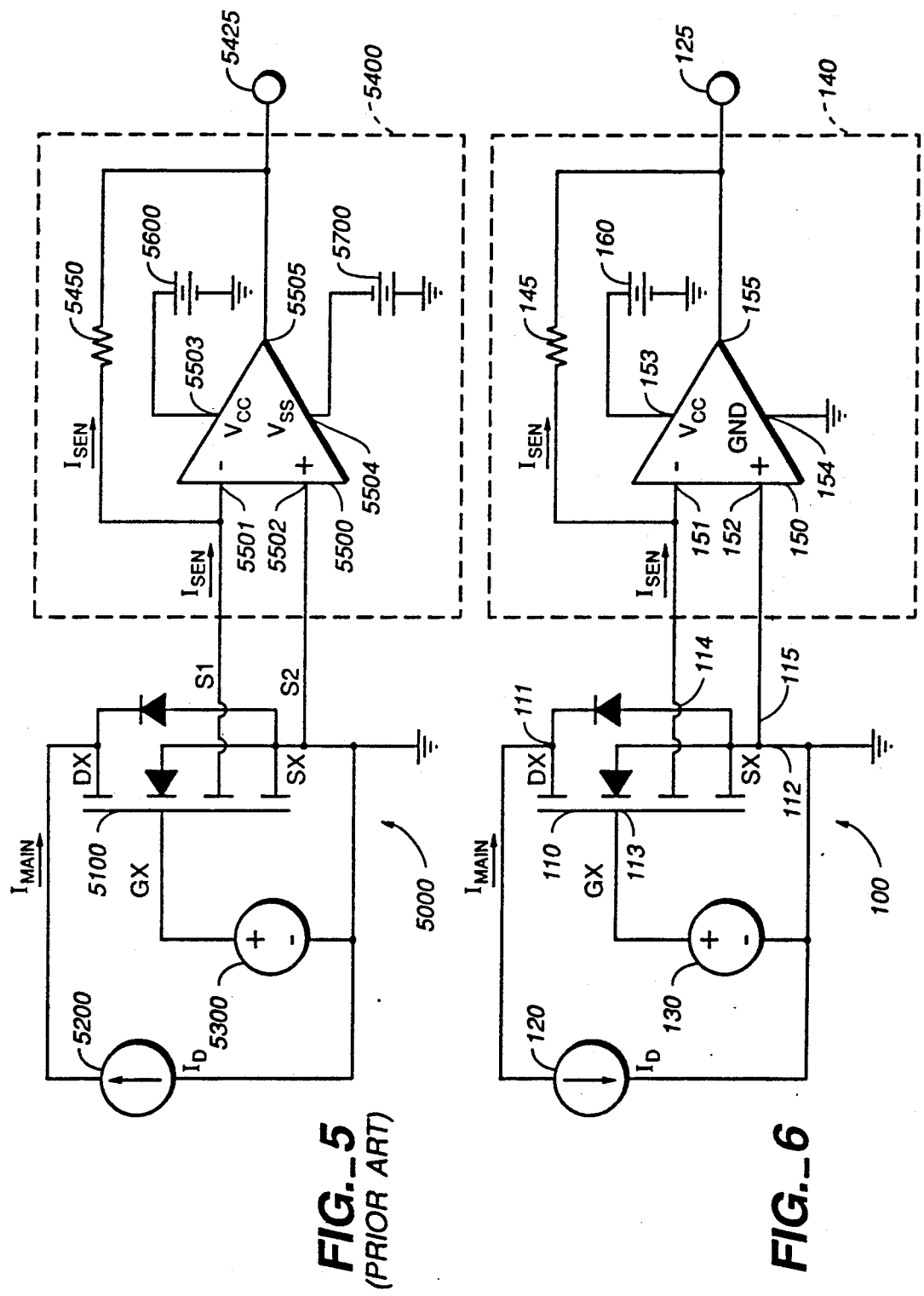
FIG._5 (PRIOR ART)
FIG._6

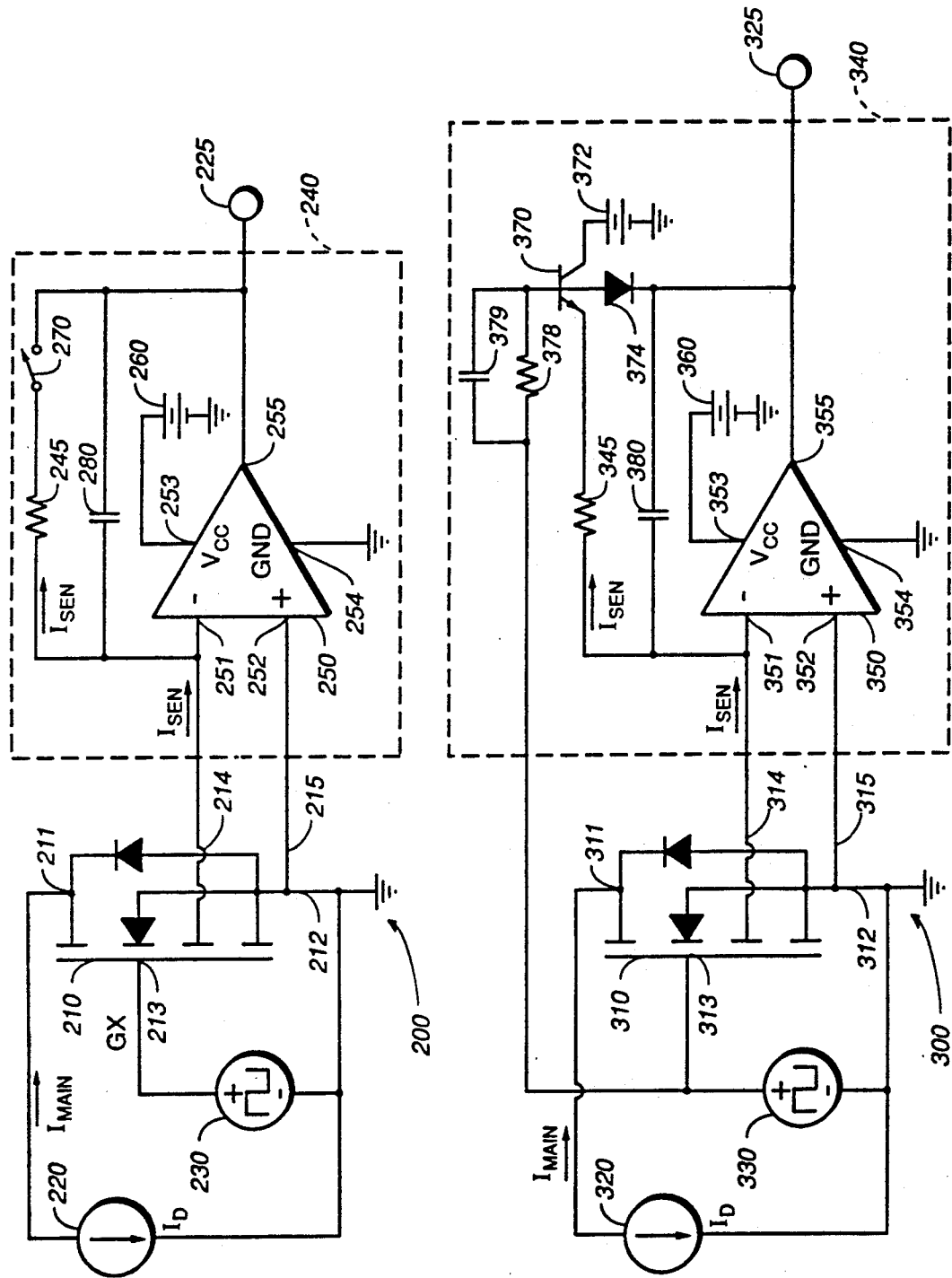

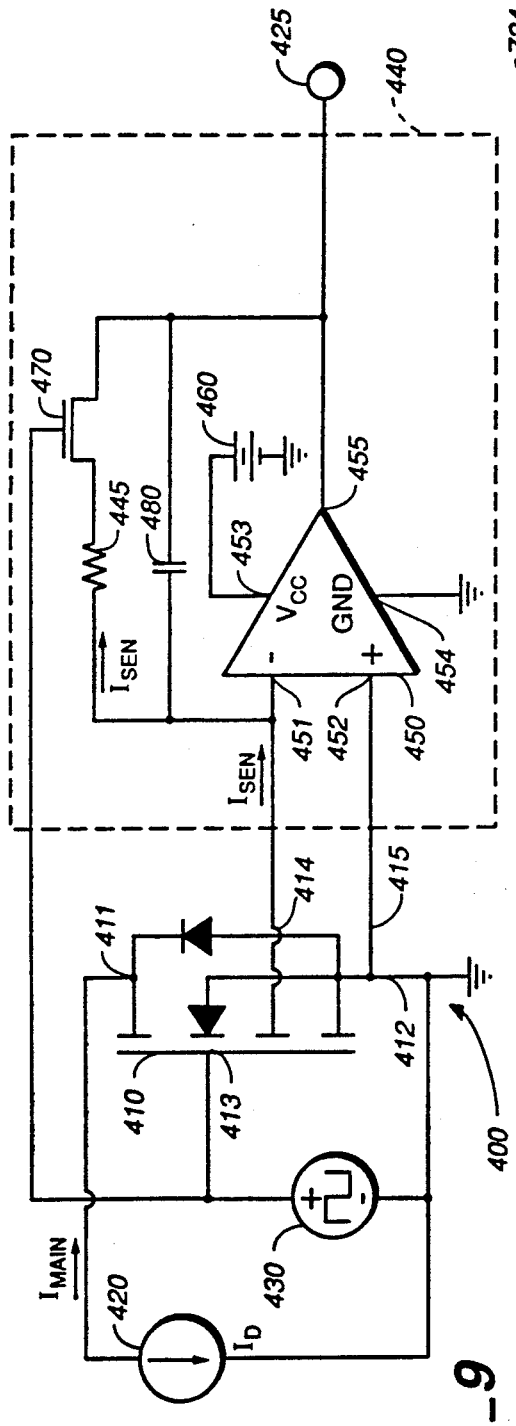
FIG._9
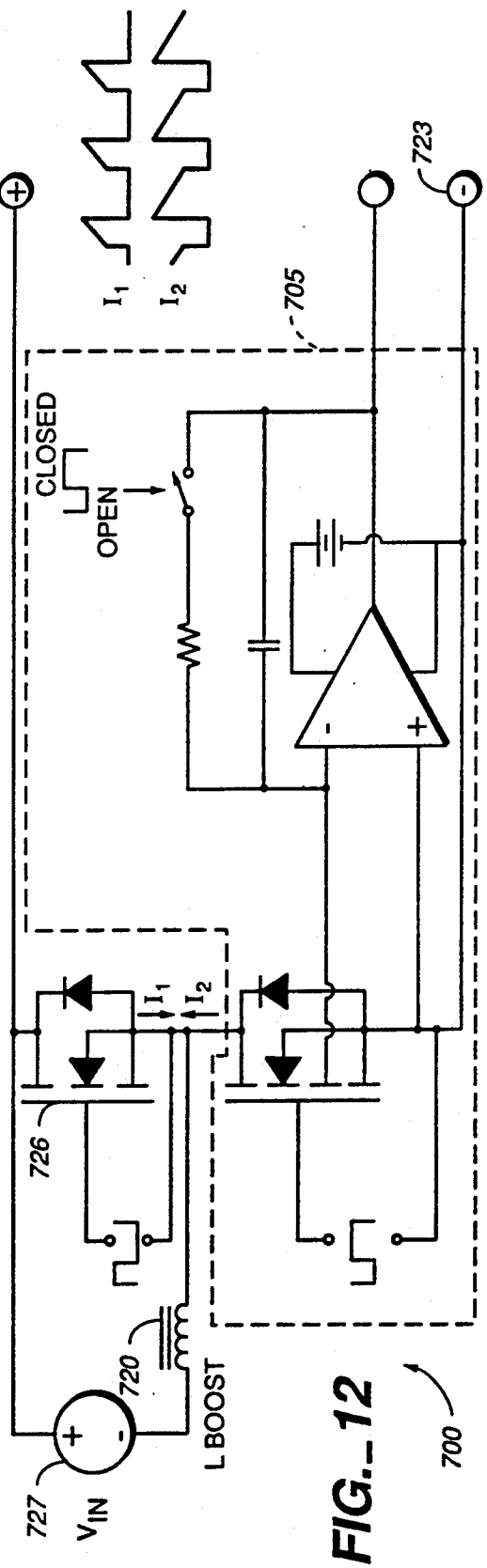
FIG._12

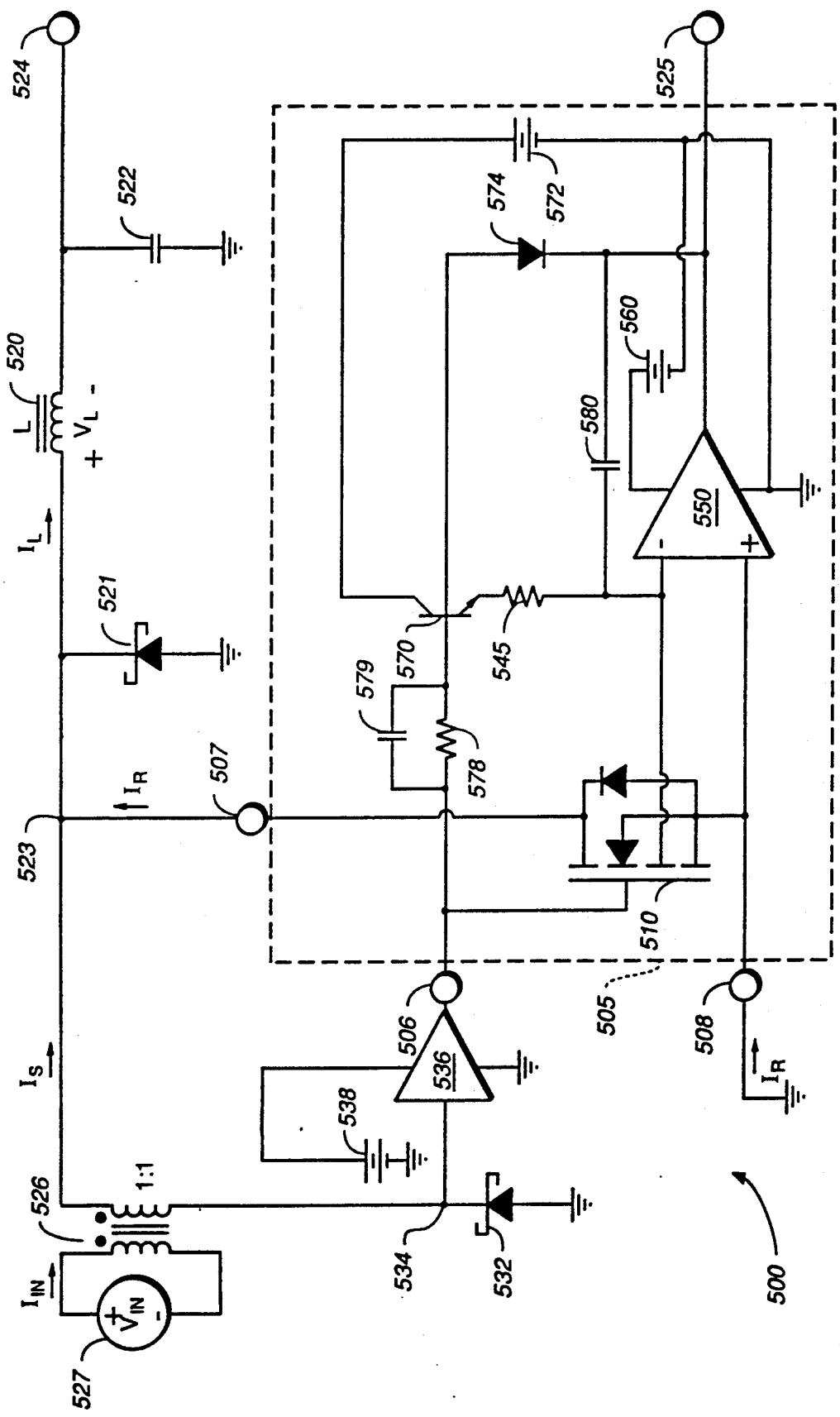
FIG._10

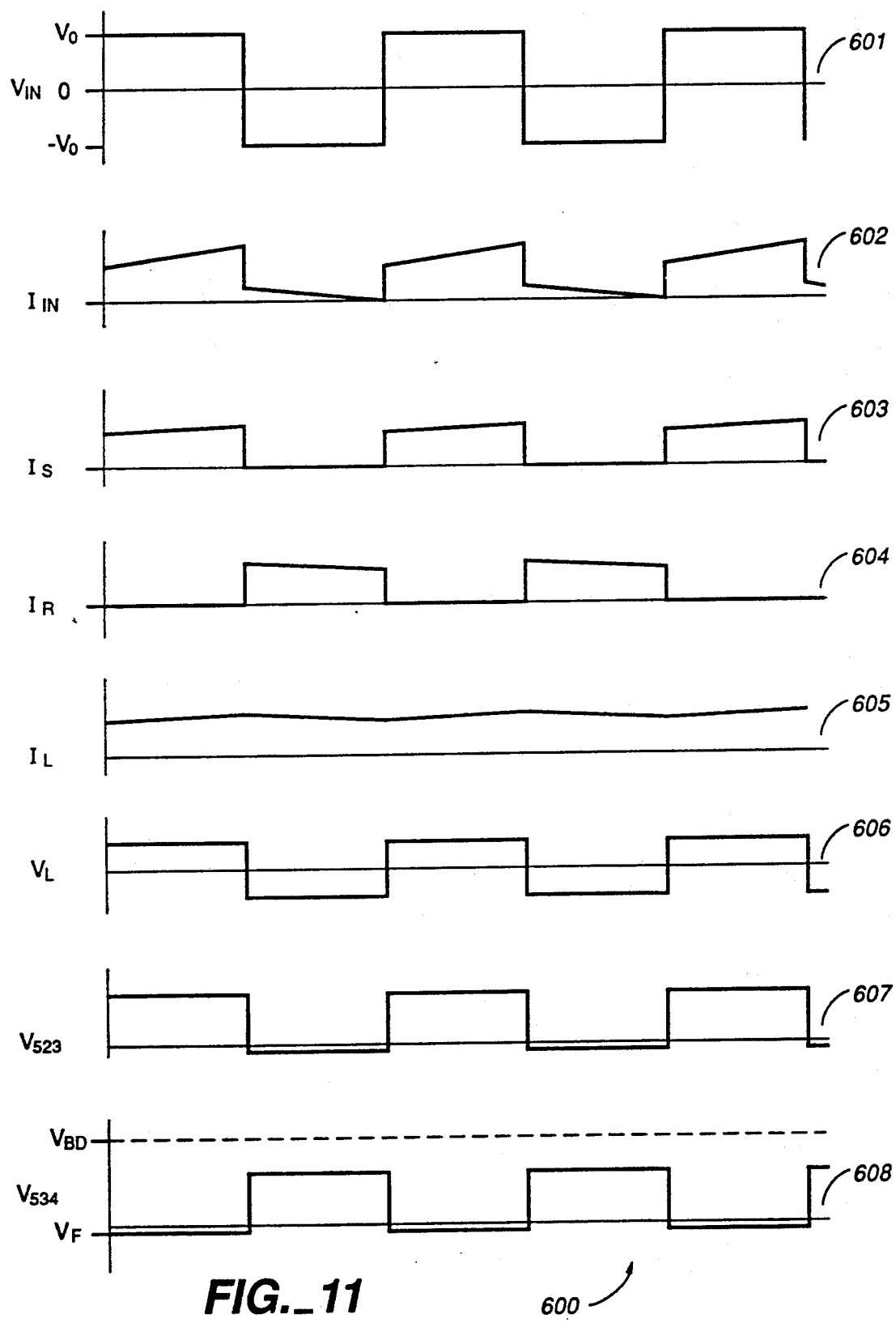
FIG._11

CURRENT SENSING SYNCHRONOUS RECTIFIER APPARATUS

FIELD OF THE INVENTION

The present invention relates to the fields of controlled rectifiers and current-sensing active devices. In particular, the present invention relates to rectifier, active measurement, and sample-and-hold circuits.

BACKGROUND OF THE INVENTION

Power supply and power conversion systems represent two major application areas for rectifying devices. Exemplary applications include AC-to-DC converters which use rectifier bridges, and boost and buck converters which use switches and rectifiers to deliver power from a source potential to a destination potential via an inductor storage device.

In the fields of power conversion and distribution, there are several ideal characteristics for a rectifier. To minimize power dissipation, the rectifier should conduct a high forward current with low associated forward voltage drop and conduct negligible reverse current for an applied reverse voltage. Second, the rectifier should have little variation of the rectification characteristics with respect to temperature for consistency of operation. Third, the rectifier should have a low reverse-recovery time and low reverse-recovery current to minimize current and voltage spikes. Fourth, for computer controlled power supply applications such as regulated boost and buck converters, the rectifier should provide some means for monitoring the amount of forward current to aid in the proper regulation of power and voltage.

Silicon-based diodes, specifically p-n junction diodes, are used for the majority of rectification applications. They, however, do not provide the most ideal rectification characteristics for power supply applications. First, silicon p-n junction diodes have a comparatively high forward voltage drop of 0.7 V. In contrast, field-effect transistors (e.g., MOSFET's, MESFET's) and bipolar-junction transistors (BJT's) have a conductive voltage drop on the order of 0.1 V to 0.2 V. Second, the rectification characteristics of p-n junction diodes are very sensitive to temperature in contrast to field-effect transistors. Third, the reverse recovery time of a diode and the amount of the reverse recovery current are large and increase as the diode is optimized for high forward-current conduction. In contrast, the generic FET structure can be optimized for high forward current conduction while maintaining or reducing its corresponding reverse-recovery characteristics.

Although they are typically used for current regulation applications rather than rectification applications, current-sensing devices address many of the above shortcomings of standard silicon p-n diodes. A current-sensing device generally comprises five terminals: first and second conduction terminals though which a main current flows, a modulation terminal for controlling the flow of the main current, and first and second sense terminals for providing a branch current which is proportional to the flow of the main current. A current-sensing device further comprises a plurality of main transistors coupled in parallel to one another and a sense transistor. The principle of the current-sensing device is to first conduct the main current through the main transistor and measure the voltage conditions present on the main transistors. The current-sensing device then replicates the measured voltage conditions onto the sense transistor and couples the current of the sense transistor to the first and second sense terminals. A small portion of the main current is conducted by the sense transistor.

A major drawback of using current-sensing devices in rectification applications is the need to generate a control signal for the modulation terminal. The control signal must be generated such that the main current flows efficiently in one direction through the current-sensing device. This condition requires that the control signal be synchronized to the applied voltage across the conduction terminals of the current-sensing device. For the majority of rectifier applications, the means for generating the control signal is both difficult and expensive. In the field of switching power supplies, however, the means for generating such a control signal is relatively simple and inexpensive. In many cases, such a signal is an intrinsic component of the switching power supply.

In switching power supply applications, however, there is a major difficulty in measuring the sense current of the current-sensing device. The standard passive techniques of measuring the sense current, e.g., a sense resistor, alters the applied voltages on the sense transistor and, hence, alters the value of the sense current. Active measurement techniques, such as those using differential amplifiers, do not significantly impact the applied voltages on the sense transistor and provide a more accurate measurement of the sense current. Differential amplifiers, however, require both positive and negative voltage supplies. Unfortunately, conversion and distribution applications often do not have a negative supply. The addition of the needed negative supply represents a large increase in cost, particularly for simple buck and boost converter topologies.

In summary, current-sensing devices could provide significant cost and performance benefits for switching power supply applications since they can be used to rectify current with relatively low power dissipation and can provide a measure of the rectifier current. The use of current-sensing devices is, however, hampered by the need for a negative supply.

SUMMARY OF THE INVENTION

Broadly stated, the present invention encompasses means for rectifying the current in a selected branch of an electronic circuit and for providing an output signal related to the magnitude of the rectified current in the selected branch without the need for a negative voltage source. More specifically, the present invention encompasses a current sensing rectifier for rectifying the current in a selected branch of a circuit and for providing an output signal related to the magnitude of the rectified current in the selected branch.

In particular, the present invention comprises a ground reference potential, one or more positive voltage supplies for providing electrical power at a positive potential with respect to the ground reference potential, a current sensing/switching device, and a comparison means for generating an output signal related to the rectified current in the selected branch.

The sensing/switching device comprises a current sensing device and includes a first conduction terminal, a second conduction terminal, a modulation terminal, a first sense terminal, and a second sense terminal. The switching/sensing device is coupled in series with the branch by means of the first and second conduction terminals. The switching/sensing device further includes a sense transistor having a first conduction terminal coupled to the first conduction terminal of the switching/sensing device, a second conduction terminal coupled to the first sense terminal of the switching/sensing device, and a modulation terminal coupled to the modulation terminal of the switching/sensing device. Additionally, the switching/sensing device includes at least one main transistor, each main transistor having a first conduction terminal coupled to the first conduction terminal of the switching/sensing device, a second conduction terminal coupled to the second sense terminal and to the second conduction terminal of the switching/sensing device, and a modulation terminal coupled to the modulation terminal of the switching/sensing device.

The switching/sensing device is responsive to a control signal, which is coupled to the modulation terminal of the switching/sensing device, for creating a conduction path between the first and second conduction terminals of the switching/sensing device if the control signal is in a first state and for preventing a conduction path between the first and second conduction terminals of the switching/sensing device if the control signal is in a second state. The control signal is in the first state when current is to be conducted from the second conduction terminal to the first conduction terminal and is in the second state at all other times.

The comparison means of the present invention is coupled to the first and second sense terminals and comprises means for generating a comparison output signal related to the difference of the potential of the first sense terminal and the potential of the second sense terminal. The comparison means is powered by the potential difference between a predetermined one of the positive voltage supplies and the ground reference potential. The comparison means includes a feedback means for causing the comparison output signal to be modified a predetermined amount such that the amplitude of the comparison output signal is a function of the current flowing through the branch. The comparison output signal thereby comprises the output signal of the current sensing rectifier of the present invention.

One feature of the present invention is a sample means responsive to the control signal for sampling the value of the current in the selected branch when the control signal is in the first state and for holding a sampled value of the branch current when the control signal is in the second state. The sampled value is related to the current through the branch prior to the control signal changing from the first state.

Accordingly, it is an object of the present invention to accurately determine the current conducted through a current-sensing device without the need for a negative voltage source.

It is another object of the present invention to control a current-sensing device to rectify a current flow and to provide an accurate measure of the current flow without the need for a negative voltage source.

It is yet another object of the present invention to provide a means for measuring a rectified current flow during an ON period when current flows and for holding a measured current value during an OFF period when current does not flow.

These and other objects of the present invention will become apparent to those skilled in the art from the following detailed description of the invention and from the accompanying drawings.

BRIEF DESCRIPTION OF THE DRAWINGS

FIG. 1 is a circuit diagram of a current-sensing device topology employing Metal-Oxide Field-Effect Transistors (MOSFET's) according to the prior art.

FIG. 2 is a compact circuit representation of a current-sensing device topology employing MOSFET devices according to the prior art.

FIG. 3 is an exemplary current-sensing circuit using a current-sensing device according to the prior art.

FIG. 4 is a second exemplary current-sensing circuit using a current-sensing device according to the prior art.

FIG. 5 is a third exemplary current-sensing circuit using a current-sensing device according to the prior art.

FIG. 6 is a circuit diagram of a first embodiment of a current-sensing rectifier according to the present invention.

FIG. 7 is a circuit diagram of a second embodiment of a current-sensing rectifier according to the present invention.

FIG. 8 is a circuit diagram of a third embodiment of a current-sensing rectifier according to the present invention.

FIG. 9 is a circuit diagram of a fourth embodiment of a current-sensing rectifier according to the present invention.

FIG. 10 is a circuit diagram of an exemplary switching power circuit employing a fifth embodiment of a current-sensing rectifier according to the present invention.

FIG. 11 is a timing diagram of key currents and voltages in the exemplary, switching power circuit shown in FIG. 10.

FIG. 12 is a circuit diagram of a second exemplary switching power circuit employing the second embodiment of the current-sensing rectifier according to the present invention.

DETAILED DESCRIPTION OF THE INVENTION

The features of the present invention may be better appreciated and comprehended by means of the following more detailed description of exemplary prior art current-sensing devices and applications.

An exemplary topology of a current-sensing device using silicon MOSFET transistors is shown at 1000 of FIG. 1. Current-sensing device 1000 comprises an external drain terminal 1001, which is labeled DX, an external source terminal 1002, which is labeled SX, an external gate terminal 1003, which is labeled GX, a first sense terminal 1004, which is labeled S1, and a second sense terminal, which is labeled as S2. Drain terminal 1001 and source terminal 1002 are also known as the first and second conduction terminals, respectively, since the circuit branch whose current is to be measured is conducted between these terminals. Additionally, the gate terminal 1003 is also known as the modulation terminal since the voltage applied to this terminal modulates the conduction of branch current through conduction terminals 1001 and 1002.

Current-sensing device 1000 further comprises five identical MOSFET devices 1100, 1200, 1300, 1400, and 1500, all of which are fabricated on the same integrated circuit. The drain terminal, D, of each MOSFET device is connected to first conduction terminal 1001 (external drain) and the gate terminal, G, of each MOSFET devices is connected to modulation terminal 1003 (external gate). The source terminals, S, of MOSFET devices 1100, 1200, 1300 and 1400 are connected to second conduction terminal 1002 (external source) and the source terminal of MOSFET device 1500 is connected to a first sense terminal 1004. A second sense terminal 1005 is provided in current-sensing device 1000 with a connection of that terminal to second conduction terminal 1002. A compact circuit representation of current-sensing device 1000 is shown by 2000 of FIG. 2. Current-sensing device symbol 2000 has the same five terminals as current-sensing device 1000 of FIG. 1.

Each MOSFET device 1100 through 1500 shown in FIG. 1 has a bulk terminal, B, which is connected to its respective source terminal. In each MOSFET device, there also is a parasitic diode 1007 from source to drain as a result of connecting the bulk and source terminals together. Each parasitic diode 1007 allows forward conduction from source to drain and clamps the negative voltage excursion of its respective drain terminal to less than IV with respect to its associated source terminal. The fabrication process is tailored for the optimized performance of the MOSFET devices. The parasitic diodes, therefore, have poor rectification characteristics.

Typically, MOSFET devices 1100 through 1500 have the same dimensions and are fabricated on the same integrated circuit, each MOSFET device conducts the same amount of current under the same applied voltage conditions. The functional aspect of current-sensing device 1000 is to use MOSFET devices 1100 through 1400 to conduct the main load current while using MOSFET device 1500 to monitor the current conducted by MOSFET devices 1100 through 1400. When the potential on first sense terminal S1 is the same as the potential on second sense terminal S2, the current conducted from first sense terminal S1 equals one fifth the current conducted by the main load and one fourth the current conducted by MOSFET devices 1100 through 1400.

The topology can be generalized by adding more main conducting MOSFET devices in parallel with MOSFET devices 1100 through 1400. Additionally, the topology can be generalized by altering non-critical device dimensions of the sense transistor. For current-sensing devices comprising MOSFET devices, the width of the sense transistor may be reduced to lower the proportion of main current conducted through the sense transistor. In this case, the current through the sense transistor is not equal to the current in a main transistor under the same applied voltage conditions but it is constant fraction of the current through a main transistor. As well known to the device-physics art, the fraction is equal to the width of the sense transistor divided by the width of a main transistor.

As well known in the art, each MOSFET device 1100 through 1500 of current-sensing device 1000 may be replaced by bipolar junction transistors (BJT). In one such BJT embodiment, the collector terminal of each BJT device replaces the drain terminal of its corresponding MOSFET device, the base terminal of each BJT device replaces the gate terminal of its corresponding MOSFET device, and the emitter terminal of each BJT device replace the source terminal of its corresponding MOSFET device. In a second such embodiment, the collector terminal of each BJT device replaces the source terminal of its corresponding MOSFET device, the base terminal of each BJT device replaces the gate terminal of its corresponding MOSFET device, and the emitter terminal of each BJT device replace the drain terminal of its corresponding MOSFET device. In both BJT embodiments, the base of each BJT device replaces the gate terminal of its corresponding MOSFET device since the base terminal is the modulation terminal of the bipolar junction transistor.

To be used as a rectifying device, the external modulation (gate) terminal of current-sensing device 1000 must be controlled to allow current to flow in only one direction between the conduction terminals of the current-sensing device. In effect, a control signal must be generated and applied to the modulation terminal of the current sensing device which is synchronized to the applied voltage across the conduction terminals of the current-sensing device. For the majority of rectifier applications, the means for generating the control signal is both difficult and expensive. In the field of switching power supplies, however, the means for generating such a control signal is relatively simple and inexpensive. In many cases, such a signal is an intrinsic component of the switching power supply. An exemplary switching power supply having such a control signal is shown by way of an exemplary switching power circuit according to the present invention detailed below with reference to FIG. 10. Further discussions of the modulation control signal of present invention are provided below with reference to FIGS. 6 through 11.

State-of-the-art switching power supplies often need a measure of the rectified current through certain rectifiers to properly regulate the power and voltage provided by the supplies. Using a current-sensing device, a current-sensing rectifier can be constructed which combines means for rectifying a branch current and means for measuring the resulting rectified current. The present invention encompasses this construction and is detailed further below with reference to FIGS. 6 through 11. Before discussing this construction, however, the difficulties of measuring the sense current in a current-sensing device are first discussed.

An exemplary usage of a current-sensing device in a current-sensing circuit is shown at 3000 in FIG. 3. In this example, Circuit 3000 includes a current-sensing device 3100 of the type illustrated in FIGS. 1 and 2, a load current 3200 connected between the external drain and source terminals of current-sensing device 3100, and a gate (modulation) voltage source 3300 connected between the external gate and source terminals of current-sensing device 3100. For the purposes of discussion, load current 3200 represent a selected branch whose current is to be measured and voltage source 3300 represents an applied bias which allows current to be conducted between the conduction terminals of current-sensing device 3100.

Current-sensing Circuit 3000 further comprises a current-sense loop 3400 coupled between the first sense terminal, S1, and second sense terminal, S2, of current-sensing device 3100. Assuming that the sense transistor and main transistors are the same size, the main current $I_{main}$ is equal to $N_d$ times the current $I_{sen}$ through current-sense loop 3400, where $N_d$ is the total number of MOSFET devices in current-sensing device 3100.

Unfortunately, there are no practical means for directly detecting the sense current $I_{sen}$ in current-sense loop 3400 of Circuit 3000. Usually, a resistor of low resistance value is incorporated in current-sense loop 3400 to translate the current $I_{sen}$ into a voltage $V_{sen}$, as shown by a second exemplary Current-sensing Circuit 4000 in FIG. 4. Second Current-sensing Circuit 4000 comprises a current-sensing device 4100, a load current 4200 coupled between the external drain and source terminals of current-sensing device 4100 for representing the branch whose current is to be measured, and a gate (modulation) voltage source 4300 coupled between the external gate and source terminals of current-sensing device 4100 for representing an applied bias which allows current to be conducted between the conduction terminals of current-sensing device 4100. A current-sense resistor 4450 is coupled between the first and second sense terminals of current-sensing device 4100 to form current-sense loop 4400. The incorporation of current-sense resistor 4450 disturbs the amount of applied voltage to the sense transistor of current-sensing device 4100 and, hence, the current through sense loop 4400 is not exactly equal to the main current $I_{main}$ divided by $N_d$, where $N_d$ is the total number of transistors in current-sensing device 4100.

An active solution to the practical sensing problem is shown by a third exemplary circuit at 5000 in FIG. 5. Third Circuit 5000 comprises a current-sensing device 5100, a load current 5200 coupled between the external drain and source terminals of current-sensing device 5100 for representing the branch whose current is to be measured, and a gate (modulation) voltage source 5300 coupled between the external gate and source terminals of current-sensing device 5100 for representing an applied bias which allows current to conduct between the conduction terminals of current-sensing device 5100. The current-sensing means comprises a sense resistor 5450 and a differential amplifier 5500 having an inverting input 5501, a non-inverting input 5502, a positive voltage supply terminal 5503, a negative voltage supply terminal 5504 and an output 5505. Sense resistor 5450 is coupled between inverting input 5501 and output 5505, inverting input 5501 is coupled to the first sense terminal of current-sensing device 5100 and non-inverting input 5502 is coupled to the second sense terminal of current-sensing device 5100. Output 5505 is also coupled to an output port 5425 for transmitting a voltage related to the sensed current $I_{sen}$. Positive voltage supply terminal 5503 is coupled to a positive voltage power source 5600 and negative voltage supply terminal 5504 is coupled a negative voltage power source 5700.

The connection of sense resistor 5450 between inverting input 5501 and output 5505 of differential amplifier 5500 forms a negative feedback loop in which the sense current $I_{sen}$ flows through sense resistor 5450 from non-inverting input 5501 to output 5505. Virtually no current flows into inputs 5501 and 5502 of differential amplifier 5500. The negative feedback operates to keep the voltages at inputs 5501 and 5502 at substantially the same potential, namely zero volts, and to keep the voltage of output 5505 at a potential substantially equal to $-I_{sen}R_{sen}$, where $R_{sen}$ is the resistance value of sense resistor 5450. The sense current $I_{sen}$ is not returned to the second sense terminal of current-sensing device 5100 but is returned to ground through negative supply 5700. The voltage at output 5505 provides a signal related to the sensed current and, hence, the total current through current-sensing rectifier 5000. The signal at output 5505 is transmitted via output port 5425 to be utilized, for example, in the regulation of output supply voltage for a switching power supply.

The active sense circuit presented by third example 5000 can, therefore, sense the main current $I_{main}$ without the drawbacks present in the resistive sensing example of Circuit 4000. In the fields of power conversion and distribution, the major drawback of the active sense circuit of third Circuit 5000 is the requirement of a negative supply. Oftentimes, conversion and distribution applications involve positive supply voltages where the addition of a negative supply represents a large increase in cost, particularly for simple buck and boost converters. A principle objective of the present invention is to overcome the need for a negative power supply.

A first embodiment of the current-sensing rectifier according to the present invention is shown at 100 in FIG. 6. Current-Sensing Rectifier 100 includes a current switching/sensing device 110 for switching and sensing the current in a selected circuit branch, an active-sense comparison means 140 for generating an output signal related to the magnitude of the rectified current in the branch, and a output port 125 for transmitting the output signal for use by, for example, a host circuit such as switching power supply. For the purposes of discussion, the branch whose current is to be rectified and measured by Current-Sensing Rectifier 100 is represented by a current source 120. Additionally, a control signal synchronized with the applied voltage across switching/sensing device 110 is represented by a modulation-signal source 130.

Switching/sensing device 110 comprises a current-sensing device having a first conduction terminal 111 (drain), a second conduction terminal 112 (source), a modulation terminal 113 (gate), a first sense terminal 114 and a second sense terminal 115. Current source 120 is coupled between first conduction terminal 11 and second conduction terminal 112. Modulation-signal source 130 is coupled between modulation terminal 113 (gate) and second conduction terminal 112. Without loss of generality, second conduction terminal 112 is coupled to ground for reference.

The rectification action of Current-Sensing Rectifier 100 is activated by applying a large positive voltage on modulation terminal 113 when the drain-to-source voltage of switching/sensing device 110 is negative, thus allowing current to flow from second conduction terminal 112 to first conduction terminal 111. Modulation-signal source 130 provides modulation means for controlling modulation terminal 113 such that the current flow through switching/sensing device 110 is from second conduction terminal 112 to first conduction terminal 11. Modulation-signal source 130 provides a plurality of ON-periods when current is to be conducted by switching/sensing device 110 and a plurality of OFF-periods when current is not to be conducted by switching/sensing device 110. In effect, the control signal applied to Current-Sensing Rectifier 100 has a first state, the ON-period, when current is to be conducted from second conduction terminal 112 to first conduction terminal 111 and a second state, the OFF-period, at all other times. Switching/sensing device 110 is responsive to the control signal for creating a conduction path between terminals 111 and 112 if the control signal is in the first state and for preventing a conduction path between the terminals 111 and 112 if the control signal is in the second state.

Comparison means 140 provides an accurate measure of the current flow through switching/sensing device 110, and hence through the selected circuit branch.

Comparison means 140 is coupled to the sense terminals of switching/sensing device 110 for sensing the current through device 110 and is coupled to output port 125 for transmitting a voltage related to the sensed current. Comparison means 140 includes a differential amplifier means 150 and a feedback resistor 145. Amplifier means 150 includes an inverting input 151 coupled to first sense terminal 114, a non-inverting input 152 coupled to second sense terminal 115, and an output 155 coupled to output port 125. Amplifier means 150 amplifies the potential difference between the signals at inputs 151 and 152 and transmits the amplified difference to output 155 coupled to output port 125. Amplifier means 150 further includes a ground terminal 154 which is coupled to ground and a positive voltage supply terminal 153 which is coupled to a positive voltage source 160. Amplifier means 150 and its coupling to switching/sensing device 110 provide means for comparing the potential of first sense terminal 114 to the potential of second sense terminal 115 and for generating a comparison output signal at output 155 related to the difference in these potentials.

Feedback resistor 145 is coupled between output 155 and inverting input 151 of amplifier means 150 and forms a negative feedback network therein. As a result, a portion of the comparison output signal at output 155 is coupled back to inverting input 151 to reduce the potential difference between inputs 151 and 152 to near zero volts. Consequently, the potential difference between sense terminals 114 and 115 of switching/sensing device 110 is reduced to near zero volts, causing the current flowing through the sense transistor of device 110 to be set in proportion to the current through the main transistors of device 110. As a result of the feedback, the comparison output signal at output 155, $V_{155}$, is set equal to:

$$V_{155} = \frac{-I_{sen}R_{145}}{1 + 1/A_o} \quad (1)$$

where $R_{145}$ is the resistance value of resistor 145 and $A_o$ represents the gain of amplifier means 150. In general, $A_o$ is on the order of a million and the above expression can be simplified to $V_{sen} = -I_{sen}R_{145}$. In effect, feedback resistor 145 comprises means for causing the comparison output signal at output 155 to be modified a predetermined amount such that comparison output signal is a function of the current flowing through the branch. The value of $R_{145}$ is a scaling constant which provides a useful voltage range for the sense voltage $V_{155}$ in the host application. To reflect the total branch current, the value of $R_{145}$ comprises the ratio of the total main current divided by the sense current. The negative feedback network formed by resistor 145 and amplifier 150 and the relationship (1) are well known in the operational amplifier art.

As mentioned above, resistor 145 and its coupling to amplifier means 150 provide feedback means for setting the potential difference between first sense terminal 114 and second sense terminal 115 substantially to zero. Some offset in the potential difference between sense terminals exists due to the finite gain of amplifier means 150. The offset, however, does not create a substantial difference in the applied voltages to the sense transistor in comparison to the applied voltages to the main transistors. The feedback means provided by resistor 145 and its coupling to amplifier means 150 sets the comparison output signal at output port 125 in proportion to the rectified current flowing through first conduction terminal 111 The signal at output port 125 may be utilized, for example, in the regulation of the output supply voltage for a switching power supply.

Since amplifier means 150 does not draw power from a negative supply, a negative voltage cannot be produced at output 155. For amplifier 150 and resistor 145 to properly produce a voltage at output 155 which is proportional to sense current $I_{sen}$, sense current $I_{sen}$ must have a negative value and, consequently, the current to be measured though switching/sensing device 110 must be directed from second conduction terminal 112 to first conduction terminal 111. The above described operation for modulation terminal 113 of switching/sensing device 110 is commensurate with this limitation.

The prior art in this field has taught against the conduction of current from second conduction terminal 112 to first conduction terminal 111 due to the activation of current conduction in the parasitic diodes, e.g., diodes 1007 shown in FIG. 1. It is generally held that the FET devices of switching/sensing device 110 should be biased in the saturation region (i.e., large positive drain-to-source potential) where the output impedance of the FET devices is high and the switching speed is optimal. This viewpoint derives, in part, from the close relationship between the current-sensing device topology and the current-mirror topology. In contrast, the conduction of current from second conduction terminal 112 (source) to first conduction terminal 111 (drain) of switching/sensing device 110 requires a negative drain-to-source potential and can produce current conduction through the parasitic diode of switching/sensing device 110 if the magnitude of reverse applied voltage between the drain and source is large enough. The voltage between the drain and source is limited to one diode voltage drop and the FET devices are prevented from entering the saturation region. The above viewpoint and limiting action exist for current-sensing device topologies comprising Bipolar-Junction transistors (BJT's) as well as those comprising FET devices.

In many power distribution and conversion applications, it is useful to incorporate a sample-and-hold function within Current-Sensing Rectifier 100 such that the measurement of the peak current flow during the forward ON-period can be held and transmitted during the reverse OFF-period where no current is conducted. The sample-and-hold function is shown in FIG. 7 by a second embodiment of the current-sensing rectifier of the present invention. Current-Sensing Rectifier 200 comprises the same elements of Current-Sensing Rectifier 100 shown in FIG. 6. With the exception of additional elements, each element of Current-Sensing Rectifier 200 is the same as a corresponding element of Current-Sensing Rectifier 100 shown in FIG. 6 where the number designation for each element of Current-Sensing Rectifier 200 is equal to the number designation of the corresponding element in Current-Sensing Rectifier 100 plus a value of one-hundred. The corresponding elements have the same function and interconnection with the exception of resistor 245, where a sample switch means 270 is coupled in series with resistor 245. While the interconnection of resistor 245 is different than that for resistor 145, its feedback function for setting the potential difference between sense terminal is the same.

Current-Sensing Rectifier 200 includes a current switching/sensing device 210 for switching and sensing the current in a selected circuit branch, an active-sense comparison means 240 for generating an output signal related to the magnitude of the rectified current in the branch, and a output port 225 for transmitting the output signal for use by, for example, a host circuit such as switching power supply. For the purposes of discussion, the branch whose current is to be rectified and measured by Current-Sensing Rectifier 200 is represented by a current source 220. Additionally, a control signal synchronized with the applied voltage across switching/sensing device 210 is represented by a modulation-signal source 230.

Switching/sensing device 210 comprises a current-sensing device having a first conduction terminal 211 (drain), a second conduction terminal 212 (source), a modulation terminal 213 (gate), a first sense terminal 214 and a second sense terminal 215. Current source 220 is coupled between first conduction terminal 211 and second conduction terminal 212. Modulation-signal source 230 is coupled between modulation terminal 213 (gate) and second conduction terminal 212. Without loss of generality, second conduction terminal 212 is coupled to ground for reference.

As with Current-Sensing Rectifier 100, the rectification action of Current-Sensing Rectifier 200 is activated by applying a large positive voltage on modulation terminal 213 when the drain-to-source voltage of switching/sensing device 210 is negative, thus allowing current to flow from second conduction terminal 212 to first conduction terminal 211. The control signal applied to Current-Sensing Rectifier 100 by modulation-signal source 230 has a first state, the ON-period, when current is to be conducted from second conduction terminal 212 to first conduction terminal 21 and a second state, the OFF-period, at all other times. Switching/sensing device 210 is responsive to the control signal for creating a conduction path between terminals 211 and 212 if the control signal is in the first state and for preventing a conduction path between the terminals 211 and 212 if the control signal is in the second state.

Comparison means 240 accurately measures the current flow through switching/sensing device 210. Comparison means 240 includes a differential amplifier means 250, a feedback resistor 245, a sample switch means 270, and a hold capacitor 280. Amplifier means 250 includes an inverting input 251 coupled to first sense terminal 214 of device 210, a non-inverting input 252 coupled to second sense terminal 215 of device 210 and an output 255 coupled to output port 225. Amplifier means 250 amplifies the potential difference between the signals at inputs 251 and 252 and transmits the amplified difference to output 255. Amplifier means 250 further includes a ground terminal 254 which is coupled to ground and a positive power-supply terminal 253 which is coupled to a positive voltage source 260. Amplifier means 250 and its coupling to switching/sensing device 210 provide means for comparing the potential of first sense terminal 214 to the potential of second sense terminal 215 and for generating a comparison output signal at output port 225 related to the difference in these potentials.

Resistor 245 is coupled in series with sample switch means 270 and the series combination is coupled between inverting input 251 and output 255. Hold capacitor 280 is also coupled between inverting input 251 and output 255 of amplifier means 250. Resistor 245 and sample switch means 270 form a switched negative feedback network with amplifier means 250. When sample switch means 270 is closed, the action of the negative feedback network sets the voltage of output 255 to $V_{255} = -I_{sen}R_{245}$, as described above with reference to Current-Sensing Rectifier 100, where $R_{245}$ is the resistance of resistor 245 and $V_{255}$ is the voltage of output 255 with respect to the ground potential.

Resistor 245 and its coupling to amplifier means 250 provide feedback means for setting the potential difference between first sense terminal 214 and second sense terminal 215 substantially to zero when switch means 270 is closed. Some offset in the potential difference between sense terminals exists due to the finite gain of amplifier means 250. The offset, however, does not create a substantial difference in the applied voltages to the sense transistor in comparison to the applied voltages to the main transistors. The feedback means provided by resistor 245 and its coupling to amplifier means 250 sets the comparison output signal at output port 225 in proportion to the current flowing through conduction terminals 211 and 212.

Since amplifier means 250 does not draw power from a negative supply, a negative voltage cannot be produced at output 255. For amplifier 250 and resistor 245 to properly produce a voltage at output 255 which is proportional to sense current $I_{sen}$, sense current $I_{sen}$ must have a negative value and, consequently, the current to be measured though switching/sensing device 210 must be directed from second conduction terminal 212 to first conduction terminal 211. The above described operation for modulation terminal 213 of switching/sensing device 210 is commensurate with this limitation.

Switch means 270 is responsive to the control signal from modulation-signal source 230 for creating a conduction path between the terminals of switch means 270 if the control signal is in the first state and for preventing a conduction path between the terminals of switch means 270 if the control signal is in the second state. In effect, switch means 270 is closed when the modulation (gate) terminal of switching/sensing device 210 is activated with a positive voltage and is opened when the modulation (gate) terminal of switching/sensing device 210 is deactivated with voltage near ground.

When switch means 270 is closed during an ON-period (first control state), the negative feedback means formed by amplifier means 250 and resistor 245 sets the sense voltage at amplifier output 255 equal to $V_{sen} = -I_{sen}R_{245}$, where $R_{245}$ is the resistance value of resistor 245. Hold capacitor 280 is charged during the ON-period to a voltage equal to the potential difference between output 255 and inverting input 251.

During the OFF-period (second control state) of switching/sensing device 210, first sense terminal 214 is electrically isolated from the other terminals of switching/sensing device 210 and switch means 270 is opened. This isolation and the opening of switch means 270 prevent charge leakage from hold capacitor 280 by electrically isolating the terminal of capacitor 280 that is coupled to inverting input 251. The potential difference developed between inverting input 251 and amplifier output 255 when sample switch means 270 is closed during an ON-period (first control state) is thereby maintained by hold capacitor 280 when sample switch means 270 is opened during an OFF-period (second control state). The voltage developed at output port 225 when current is conducted by Current-Sensing Rectifier 200 is thereby maintained when current is not conducted. Sample switch means 270, hold capacitor 280, and their coupling to resistor 245 and amplifier means 250 provide sample means for sampling the current in Current-Sensing Rectifier 200 during an ON-period (first control state) and holding a sampled value during a subsequent OFF-period (second control state).

It may be appreciated that the positions of feedback resistor 245 and sample switch means 270 may be exchanged without disturbing the above described functions of comparison means 240. In this exchange of positions, sample switch means 270 is coupled to inverting input 251 and feedback resistor 245 is coupled to output 255.

In practice, sample switch means 270 comprises a Bipolar-Junction transistor (BJT) or a Field-Effect transistor (FET). A third embodiment using a BJT device in the current-sensing rectifier according to the present invention is shown at 300 in FIG. 8. With exception of sample switch means 270 and additional elements of Current-Sensing Rectifier 300, each element of Current-Sensing Rectifier 300 is the same as a corresponding element of Current-Sensing Rectifier 200 shown in FIG. 7 where the number designation for each element of Current-Sensing Rectifier 300 is equal to the number designation of the corresponding element in Current-Sensing Rectifier 200 plus a value of one-hundred. The corresponding elements have the same function and interconnection with the exception of resistor 345, where a bipolar-junction transistor 370 and a diode 374 are coupled into the branch path of resistor 345. While the interconnection of resistor 345 is different than that for resistor 245, its feedback function for setting the potential difference between sense terminal is the same.

Current-Sensing Rectifier 300 includes a current switching/sensing device 310 for switching and sensing the current in a selected circuit branch, an active-sense comparison means 340 for generating an output signal related to the magnitude of the rectified current in the branch, and a output port 325 for transmitting the output signal for use by, for example, a host circuit such as switching power supply. For the purposes of discussion, the branch whose current is to be rectified and measured by Current-Sensing Rectifier 300 is represented by a current source 320. Additionally, a control signal synchronized with the applied voltage across switching/sensing device 310 is represented by a modulation-signal source 330.

Switching/sensing device 310 comprises a current-sensing device having a first conduction terminal 311 (drain), a second conduction terminal 312 (source), a modulation terminal 313 (gate), a first sense terminal 314 and a second sense terminal 315. Current source 320 is coupled between first conduction terminal 311 and second conduction terminal 312. Modulation-signal source 330 is coupled between modulation terminal 313 (gate) and second conduction terminal 312. Without loss of generality, second conduction terminal 312 is coupled to ground for reference.

Comparison means 340 includes a feedback resistor 345, a differential amplifier means 350, a positive supply 360, a bipolar-junction transistor 370, a level-shift diode 374, a base-bias resistor 378, and a hold capacitor 380. The functionality of sample switch means 270 of Current-Sensing Rectifier 200 is provided by a combination of bipolar-junction transistor 370, a positive power supply 372, level-shift diode 374, and base-bias resistor 378. Bias resistor 378 is coupled between modulation-signal source 330 and the base terminal of transistor 370. Bias resistor 378 provides drive means for coupling the base of transistor 370 to the control signal of source 330 such that bipolar-junction transistor 370 allows current conduction between collector and emitter terminals during ON-periods (first control state) and prevents current conduction between collector and emitter terminals during OFF-periods (second control state).

The emitter and collector of transistor 370 are coupled to feedback resistor 345 and supply 372, respectively, and provide a path for the sense current $I_{sen}$. The anode of level-shift diode 374 is coupled to the base of transistor 370 and the cathode of level-shift diode is coupled to the output 355 of amplifier means 350. Level-shift diode 374, in combination with the emitter-base junction of transistor 370, provides a means for coupling the voltage of output 355 to feedback resistor 345 when transistor 370 is activated and for de-coupling the voltage of output 355 from resistor 345 when transistor 370 is not activated.

When activated, transistor 370 operates in the emitter-follower mode and places the emitter voltage of transistor 370 at one junction voltage ($V_{BE(on)}$) below the base voltage of transistor 370. Similarly, diode 374 places the voltage of the base of transistor 370 at one forward diode-voltage drop $V_{D(on)}$ above the voltage at amplifier output 355. Transistor 370 and diode 374 can be chosen such that the junction voltage $V_{BE(on)}$ equals the forward diode-drop $V_{D(on)}$, thereby effectively coupling amplifier output 355 to resistor 345 without a voltage drop.

When deactivated, transistor 370 isolates its emitter, base, and collector terminals and current is prevented from flowing. During this state, hold capacitor 380 preserves the potential difference between inverting input 351 and amplifier output 355 and the voltage on output port 325. Current-Sensing Rectifier 300 thereby maintains a measure of the current flow through switching/sensing device 310 during OFF periods.

To speed up the transient switching of bipolar-junction transistor 370, a speed-up capacitor 379 may be coupled in parallel with base-bias resistor 378, as well known in the circuit art. During steady-state conduction of current from collector to emitter, transistor 370 requires an amount of base current in proportion to the amount of steady-state collector current. Base-bias resistor 378 and the potential difference across it provide the required steady-state base current. While switching from a non-conducting to a conducting state, capacitances associated with the base-emitter junction and minority carriers in the intrinsic base region must be charged before transistor 370 can support the desired steady state collector current. The same capacitances must be discharged while switching from a conducting to a non-conducting state before transistor 370 can stop the current flow from collector to emitter. Delays in switching transistor 370 with respect to switching/sensing device 310 can result in inaccurate sampled values provided to hold capacitor 380.

Speed-up capacitor 379 detects the rising and falling edges of the switching signal provided by modulation-signal source 320 an provides additional current for charging and discharging the associated base capacitances of transistor 370. The excess transient currents speed the switching of states and substantially reduces sampling errors on hold capacitor 380. The capacitance value of speed-up capacitor 379 depends upon the switching responsive time of switching/sensing device 310 and transistor 370 and is chosen by methods well known in the art.

Although two positive voltage supplies, supplies 360 and 372, are shown in comparison means 340, a single positive voltage supply may be used to power both transistor 370 and differential amplifier means 350. For example, the collector of transistor 370 may be connected to supply 360 and supply 372 may be eliminated. One advantage of having two supplies is that the voltage provided by supply 372 may be larger than the voltage provided by supply 360 and, as such, may be used to prevent transistor 370 from entering the reverse-active and saturation modes of operation. This may be verified by noting that the voltage of amplifier output 355 is limited to the voltage of supply 360, the base of transistor 370 is limited to the voltage of supply 360 plus the diode voltage drop of diode 374, and that the voltage at the emitter of transistor 370 is limited to approximately the voltage of supply 360.

It may be appreciated that the positions of feedback resistor 345 and sample switch means comprising transistor 370 and diode 374 may be exchanged without disturbing the above described functions of comparison means 340. In this exchange of positions, the emitter terminal of transistor 370 is coupled to inverting input 351, the cathode terminal of diode 374 is coupled to the first terminal of resistor 345, and the second terminal of resistor 345 is coupled to output 355. The base terminal of transistor 370 remains coupled to bias resistor 378, capacitor 379, and to the anode terminal of diode 374. Additionally, the collector terminal of transistor 370 remains coupled to supply 372.

A fourth embodiment using a FET device in the sample switch means of the current-sensing rectifier according to the present invention is shown at 400 in FIG. 9. With exception of sample switch means 270, each element of Current-Sensing Rectifier 400 is the same as a corresponding element of Current-Sensing Rectifier 200 shown in FIG. 7 where the number designation for each element of Current-Sensing Rectifier 400 is equal to the number designation of the corresponding element in Current-Sensing Rectifier 200 plus a value of two-hundred. The corresponding elements have the same function and interconnection.

Current-Sensing Rectifier 400 includes a current switching/sensing device 410 for switching and sensing the current in a selected circuit branch, an active-sense comparison means 440 for generating an output signal related to the magnitude of the rectified current in the branch, and an output port 425 for transmitting the output signal for use by, for example, a host circuit such as switching power supply. For the purposes of discussion, the branch whose current is to be rectified and measured by Current-Sensing Rectifier 400 is represented by a current source 420. Additionally, a control signal synchronized with the applied voltage across switching/sensing device 410 is represented by a modulation-signal source 430.

Switching/sensing device 410 comprises a current-sensing device having a first conduction terminal 411 (drain), a second conduction terminal 412 (source), a modulation terminal 413 (gate), a first sense terminal 414 and a second sense terminal 415. Current source 420 is coupled between first conduction terminal 411 and second conduction terminal 412. Modulation-signal source 430 is coupled between modulation terminal 413 (gate) and second conduction terminal 412. Without loss of generality, second conduction terminal 412 is coupled to ground for reference.

Comparison means 440 includes a feedback resistor 445, a differential amplifier means 450, a positive supply 460, a field-effect transistor 470, and a hold capacitor 480. The functionality of sample switch means 270 shown in FIG. 7 is provided by a field-effect transistor 470 shown in FIG. 8. The gate terminal of transistor 470 is coupled to modulation-signal source 430 such that transistor 470 allows current conduction between source and drain terminals during ON-periods (first control state) and prevents current conduction between source and drain emitter terminals during OFF-periods (second control state).

The drain terminal of field-effect transistor 470 is connected to output 455 of differential amplifier means 450 and the source terminal of field-effect transistor 470 is connected to feedback resistor 445. The above connection of transistor 470 provides a means for coupling resistor 445 to amplifier output 455 when transistor 470 is activated and for de-coupling resistor 445 to amplifier output 455 when transistor 470 is not activated. Transistor 470 may comprise an enhancement-mode device or a depletion-mode device. In the latter case, the potential voltage applied to the gate of transistor 470 during OFF-periods must be sufficiently negative to prevent conduction through transistor 470.

In comparison with the resistance value of resistor 445, transistor 470 has a low resistance when activated and a high resistance when de-activated. When transistor 470 comprises an enhancement device, the gate potential of transistor 470 must be higher than the drain potential of transistor 470 to maintain a low resistance during activation. This generally limits the maximum voltage level for output 455 when using an enhancement device.

When activated, transistor 470 conducts with a minimal amount of resistance and couples resistor 445 to output 455. The feedback loop is activated and the voltage at output port 425 is set at $V_{425} = -I_{sen}R_{445}$, where $R_{445}$ is the resistance of resistor 445 and $V_{425}$ is the voltage at output port 425. When deactivated, transistor 470 isolates its source and drain terminals from one another and current is prevented from conducting. During this state, hold capacitor 480 preserves the potential difference between inverting input 451 and amplifier output 455 and the voltage on amplifier output port 425. Current-Sensing Rectifier 400 thereby maintains a measure of the current flow through switching/sensing device 410 during the OFF-period.

It may be appreciated that the positions of feedback resistor 445 and sample switch means comprising transistor 470 may be exchanged without disturbing the above described functions of comparison means 440. In this exchange of positions, the source terminal of transistor 470 is coupled to inverting input 451, the drain terminal of transistor 470 is coupled to the first terminal of resistor 445, and the second terminal of resistor 445 is coupled to output 455. The gate terminal of transistor 470 remains coupled to modulation-signal source 430.

As discussed above, the control signal to the modulation terminal of a current sensing device must be synchronized to the applied voltage across its conduction terminals to provide current rectification. For the majority of rectifier applications, the means for generating this control signal is both difficult and expensive. In the field of switching power supplies, however, the means for generating such a control signal is relatively simple and inexpensive. In many cases, such a signal is an intrinsic component of the switching power supply. An exemplary switching power application providing such a control signal for the current-sensing rectifier according to the present invention is shown at 500 in FIG. 10. Power Switching Circuit 500 comprises an input power source 527 and an output port 524. One goal of Power Switching Circuit 500 is to provide power at an output port 524 at a lower potential than the power provided by input power source 527. An additional goal of Power Switching Circuit 500 is to provide the power conversion with a minimal amount of power dissipation loss.

Power Switching Circuit 500 comprises an output capacitor 522 coupled between output port 524 and ground, a buck inductor 520 having a first terminal coupled to output port 524 and a second terminal coupled to an intermediate node 523, a first rectifier 521 having an anode coupled to ground and a cathode coupled to node 523, and a Current-Sensing Rectifier 505 according to the present invention coupled between node 523 and ground for providing a path of rectified current from ground to node 523. Power Switching Circuit 500 further comprises a transformer 526 for coupling power into Switching Circuit 500 from power source 527, a second rectifier 532 for directing the power coupled from transformer 526 to intermediate node 523, and a buffer amplifier 536 for quantizing the voltage at an intermediate node 534 into useful digital-signal levels. Second rectifier 532 has an anode coupled to ground and a cathode coupled to node 534. Transformer 526 has a primary winding coupled to power source 527 and a secondary winding having a first terminal coupled to node 523 and a second terminal coupled to intermediated node 534. For the purposes of discussion, the turns ratio for transformer 526 is taken to be 1 to 1.

Current-Sensing Rectifier 505 comprises a control port 506 for receiving a synchronized modulation control signal, a cathode port 507, and an anode port 508. Control port 506 is coupled to the output of buffer amplifier 536, cathode port 507 is coupled to node 523, and anode port 508 is coupled to ground. With the exception of ports 506 through 508, each element of Current-Sensing Rectifier 505 is the same as a corresponding element of Current-Sensing Rectifier 300 shown in FIG. 8 where the number designation for each element of Current-Sensing Rectifier 505 is equal to the number designation of the corresponding element in Current-Sensing Rectifier 300 plus a value of two-hundred. Ports 506 through 508 have been added to highlight the exemplary use of the Current-Sensing Rectifier according to the present invention within Power Switching Circuit 500. It may be understood that other embodiments of the present invention may be used within Power Switching Circuit 500.

In general, voltage source 527 comprises a D.C. power supply and a modulating switch means which selectively couples power to transformer 526. For the purposes of discussion, source 527 can be simplified to and modeled as a square-wave generator. A timing diagram 600, shown in FIG. 11, is used to illustrate exemplary timing of various signal points in the circuit shown in FIG. 10. The output of voltage source 527, $V_{IN}$, is shown in timing diagram 600 at waveform 601. The signal provided by voltage source 527 is a square wave having a 50% duty cycle and equal positive and negative voltage swings of magnitude $V_0$. The frequency, amplitude, and pulse-width modulation provided by source 527 is not relevant to the discussion of the current sensing rectifier of the present invention. Any specific characteristics of source 527 is intended to be exemplary to facilitate the discussion of the present invention and is not intended as a limitation of the present invention or applications thereof.

The combination of voltage source 527, power transformer 526, and rectifier 532 comprise means for directing power to node 523 during each positive half-cycle of voltage source 527. Additionally, the combination of voltage source 527, power transformer 526, rectifier 532, and buffer amplifier 536 comprise modulation means for generating the modulation control signal for Current-Sensing Rectifier 505. During each positive cycle of voltage source 527, the power directed towards node 523 flows through inductor 520. During this time, power is supplied to output node 524 and is stored in the magnetic fields of inductor 520. During the positive half-cycle of voltage source 527, the signal coupled at control port 506 of Current-Sensing Rectifier 505 is low and prevents Current-Sensing Rectifier 505 from supplying current through cathode port 507.

During the negative half-cycle of voltage source 527, the direction of power towards node 523 from power transistor 526 is stopped by rectifier 532. During this time, the voltage at node 534 rises to activate Current-Sensing Rectifier 505 to provide current though cathode port 507, as denoted by the symbol $I_R$. The flow of current $I_R$ from cathode port 507 is driven by the collapsing magnetic field of buck inductor 520. As a consequence, node 523 swings down to a negative voltage from its previous high voltage of $+V_0$. The current path for the current $I_R$ from cathode port 507 is completed by a current flow into Current-Sensing Rectifier 505 at anode port 508.

Key voltage and current waveforms for Power Switching Circuit 500 are shown by timing diagram 600 in FIG. 11 The square shaped waveform provided by voltage source 527 is shown at $V_{IN}$ waveform 601. Waveform 601 has a 50% duty cycle with a positive half-cycle voltage of $+V_0$ and a negative half-cycle voltage of $-V_0$. The following exemplary conditions are taken for the operation of Power Switching Circuit 500: steady state operation, a voltage of $V_0/2$ for output node 524, and equal ripple-up and ripple-down current slopes in inductor 520. These conditions are intended to facilitate the description of Power Switching Circuit 500 and are not intended as limitations of the present inventions or applications thereof.

The operation of Power Switching Circuit 500 may be best understood by first deriving the voltage waveform at node 523. During the positive half-cycle of voltage source 527, as shown by $V_{IN}$ waveform 601 in FIG. 11, the voltage at node 523 is equal to $V_0$ less the forward voltage drop of rectifier 532. During the negative half-cycle of waveform $V_{IN}$, Current-Sensing Rectifier 505 is activated and lowers the voltage at node 523 to a small negative value with respect to the ground reference, typically $-100$ mV to $-200$ mV. The resulting waveform for the voltage at node 523 is shown at a waveform 607 in FIG. 11.

The voltage at node 534 may then be deduced as the voltage waveform at node 523 less the waveform of voltage source 527, i.e., $V_{IN}$ waveform 601. The waveform at node 534 is shown by a waveform 608 in FIG. 11. During the positive half-cycle of $V_{IN}$ waveform 601, the voltage at node 534 is negative and equal in magnitude to one diode voltage drop. During the negative half-cycle of $V_{IN}$ waveform 601, the voltage at node 534 is equal to $V_0$ less the modest potential across Current-Sensing Rectifier 505, typically 100 mV to 200 mV. The reverse bias breakdown voltage of rectifier 532 denoted as $V_{BD}$, is chosen to be greater than the positive voltage of node 534. This is indicated in $V_{534}$ waveform 608 by the voltage level indication at $V_{BD}$. The positive voltage generated at node 534 during the negative half-cycle of $V_{IN}$ waveform 601 is sufficient in magnitude to properly operate Current-Sensing Rectifier 505 via buffer amplifier 536. As such, the coupling of the voltage at node 534 to control port 506 and the voltage at node 523 to cathode port 507 provide means for synchronizing the current flow through Current-Sensing Rectifier 505 such that current only flow from anode port 508 to cathode port 507.

To complete the discussion of Power Switching Circuit 500, the voltage across buck inductor 520, notated as $V_L$, is shown at a waveform 605 in FIG. 11. The voltage across buck inductor 520 may be easily deduced from the given waveform of the voltage at node 523 and the fixed voltage of $V_0/2$ at output node 524. $V_L$ waveform 606 has equal positive and negative levels, each level having a magnitude of $V_0/2$ less a modest voltage due to diode drops of rectifier 532 and Current-Sensing Rectifier 505. The modest diode drops are present in the voltage at node 523 and are, consequently, incorporated into $V_{532}$ waveform 608.

The resulting current though buck inductor 520 is shown by a waveform 605 in FIG. 11. The current though buck inductor 520 comprises a D.C. component plus a waveform having equal ripple-up and ripple-down currents The currents $I_S$ and $I_R$ into node 523 may be deduced by the current waveform for buck inductor 520 and the switching behavior of Current-Sensing Rectifier 505. The current waveforms for $I_S$ and $I_R$ are shown at two waveforms 603 and 604, respectively, of FIG. 11. In essence, $I_S$ waveform 603 contains the positive half-cycle contributions of the inductor current waveform 605 and $I_R$ waveform 604 contains the negative half-cycle current of $I_L$ waveform 605. Given the waveform $I_S$ and the well known transformer laws known to the art, the current provided by voltage source 527 may be determined. This current is denoted by $I_{IN}$ and is shown by a waveform 602 in FIG. 11. $I_{IN}$ waveform 602 comprises a component which mirrors $I_S$ waveform 603 plus a component which accounts for the magnetizing current in power transformer 526.

In summary, Power Switching Circuit 500 demonstrates means for generating the modulation control signal for proper operation of the current sensing rectifier of the present invention. The modulation control signal synchronizes Current-Sensing Rectifier 505 to the applied voltage across conduction terminals of Rectifier 505 to provide current rectification. It may be appreciated that other methods well known to the art may be used to generate the modulation control signal.

It may be further appreciated that the current-sensing rectifier according to the present invention may be incorporated into other power converter topologies other than the buck-converter topology of Power Switching Circuit 500. For example, the current-sensing rectifier of the present invention may be incorporated into the boost-converter topology of a second power switching circuit shown at 700 in FIG. 12. Power Switching Circuit 700 comprises an input power source 727, a positive output terminal 724, a negative output terminal 723, a primary switch means 726, a boost inductor 720, and a Current-Sensing Rectifier 705 according to the present invention. Current-Sensing Rectifier 705 is powered by a voltage source that is ground-referenced to negative terminal 723. Primary switch means 726 and the current switching/sensing device of Current-Sensing Rectifier 705 are switched opposite to one another. Likewise, the sample switch means of Current-Sensing Rectifier 705 is switched opposite to primary switch means 726. The modulation control means for Current-Sensing Rectifier 705 and primary switch means 726 is not formally shown but may be constructed by techniques well known in the power supply switching art. In the preferred embodiment of Power Switching Circuit 700, the modulation control means is ground-referenced at negative output terminal 723.

It may be appreciated that the current-sensing rectifier according to the present invention accurately determines the current conducted through a current-sensing device without the use of a negative voltage source. It may be also appreciated that the current-sensing rectifier according to the present invention controls a current-sensing device to rectify a current flow and to provide an accurate measure of the current flow without the use of a negative voltage source. It may be further appreciated that further embodiments of the present invention hold an accurate measure of rectifier current during OFF periods.

While the invention has been described in connection with what is presently considered to be the most practical and preferred embodiments, it is to be understood that the present invention is not limited to the disclosed embodiments but, on the contrary is intended to cover various modifications and equivalent arrangements included within the scope of the appended claims.

What is claimed is:

1. A current sensing rectifier for rectifying the current in a selected branch of a circuit and for providing an output signal related to the magnitude of the rectified current in said branch, comprising:

a ground reference potential;

one or more positive voltage supplies for providing electrical power at a positive potential with respect to said ground reference potential;

a switching/sensing device including a first conduction terminal, a second conduction terminal, a modulation terminal, a first sense terminal, and a second sense terminal, said switching/sensing device coupled in series with said branch by means of said first and second conduction terminals, said switching/sensing device further including a sense transistor having a first conduction terminal coupled to said first conduction terminal of said switching/sensing device, a second conduction terminal coupled to said first sense terminal of said switching/sensing device, and a modulation terminal coupled to said modulation terminal of said switching/sensing device, and at least one main transistor, each said main transistor having a first conduction terminal coupled to said first conduction terminal of said switching/sensing device, a second conduction terminal coupled to said second sense terminal and said second conduction terminal of said switching/sensing device, and a modulation terminal coupled to said modulation terminal of said switching/sensing device, said switching/sensing device responsive to a control signal coupled to said modulation terminal of said switching/sensing device for creating a conduction path between said first and second conduction terminals of said switching/sensing device if said control signal is in a first state and for preventing a conduction path between said first and second conduction terminals of said switching/sensing device if said control signal is in a second state, said control signal being in said first state when current is to be conducted from said second conduction terminal to said first conduction terminal and being in said second state at all other times; and comparison means coupled to said first and second sense terminals for generating a comparison output signal related to the difference of the potential of said first sense terminal and the potential of said second sense terminal, said comparison means powered by the potential difference between a predetermined one of said positive voltage supplies and said ground reference potential, said comparison means including feedback means for causing said comparison output signal to be modified a predetermined amount such that the amplitude of said comparison output signal is a function of the current flowing through said branch, said comparison output signal comprising said output signal.

2. The current sensing rectifier of claim 1 wherein said sense transistor of said switching/sensing device and each said main transistor of said switching/sensing device are fabricated in substantially the same way.

3. The current sensing rectifier of claim 1 wherein said sense transistor of said switching/sensing device comprises a field effect transistor and wherein each said main transistor of said switching/sensing device comprises a field effect transistor.

4. The current sensing rectifier of claim 1 wherein said sense transistor device and each said main transistor have substantially the same terminal currents under the same applied voltage conditions.

5. The current sensing rectifier of claim 1 wherein said comparison means comprises a differential amplifier having an inverting input coupled to said first sense terminal, a non-inverting input coupled to said second sense terminal, and an output for transmitting said comparison output signal.

6. The current sensing rectifier of claim 5 wherein said feedback means comprises a feedback resistor coupled between said inverting input of said differential amplifier and said output of said differential amplifier.

7. The current sensing rectifier of claim 1 further comprising sample means responsive to said control signal for sampling the value of the current in said branch when said control signal is in said first state and for holding a sampled value of said branch current when said control signal is in said second state, said sampled value being related to the current through said branch prior to said control signal changing from said first state.

8. The current sensing rectifier of claim 6 further comprising sample means responsive to said control signal for sampling the value of the current in said branch when said control signal is in said first state and for holding a sampled value of said branch current when said control signal is in said second state, said sampled value being related to the current through said branch prior to said control signal changing from said first state.

9. The current sensing rectifier of claim 8 wherein said sample means comprises a switch means having first and second terminals, said switch means coupled in series with said feedback resistor by means of said first and second terminals, said switch means responsive to said control signal for creating a conduction path between the terminals of said switch means if said control signal is in said first state and for preventing a conduction path between said terminals of switch means if said control signal is in said second state.

10. The current sensing rectifier of claim 9 wherein said sample means further comprises a hold capacitor connected between said inverting input of said differential amplifier and said output of said differential amplifier.

11. The current sensing rectifier of claim 9 wherein said switch means comprises:
a field effect transistor having a source terminal coupled to said feedback resistor, a drain terminal coupled to the output of said differential amplifier, and a gate terminal; and
drive means for coupling said control signal to said gate terminal such that said field effect transistor allows current conduction between said source and drain terminals of said field effect transistor when said control signal is in said first state and prevents current conduction between said source and drain terminals of said field effect transistor when said control signal is in said second state.

12. The current sensing rectifier of claim 9 wherein said switch means comprises:
a bipolar junction transistor having an emitter terminal coupled to said feedback resistor, a collector terminal coupled to one of said positive voltage supplies, and a base terminal;
a rectifier having a cathode terminal coupled to the output of said differential amplifier and an anode terminal coupled to said base terminal; and
drive means for coupling said control signal to said base terminal such that said bipolar junction transistor allows current conduction between said collector and emitter terminals when said control signal is in said first state and prevents current conduction between said collector and emitter terminals when said control signal is in said second state.

13. The current sensing rectifier of claim 12 wherein said drive means comprises a resistor having a first terminal coupled to said control signal and a second terminal coupled to said base terminal.

14. The current sensing rectifier of claim 13 wherein said drive means further comprises a capacitor having a first terminal coupled to said control signal and a second terminal coupled to said base terminal.

15. The current sensing rectifier of claim 12 wherein said comparison means and said collector terminal are powered by the same positive voltage supply.

16. The current sensing rectifier of claim 12 wherein said comparison means and said collector terminal are powered by different positive voltage supplies.

17. The current sensing rectifier of claim 1 further comprising a modulation means for generating said control signal.

18. The current sensing rectifier of claim 17 wherein said modulation means further comprises:
a rectifier having an anode coupled to said ground reference potential and a cathode terminal;
a buffer amplifier having an input terminal coupled to said cathode terminal of said rectifier and an output terminal coupled to said modulation terminal of said switching/sensing device; and a transformer having a first winding and a second winding, said secondary winding having a first terminal coupled to said first conduction terminal of said switching/device and a second terminal coupled to said cathode of said rectifier.

19. A current sensing rectifier for rectifying the current in a selected branch of a circuit and for providing an output signal related to the magnitude of the rectified current in said branch, comprising:

a ground reference potential;

one or more positive voltage supplies for providing electrical power at a positive potential with respect to said ground reference potential;

a switching/sensing device including a first conduction terminal, a second conduction terminal, a modulation terminal, a first sense terminal, and a second sense terminal, said switching/sensing device coupled in series with said branch by means of said first and second conduction terminals, said switching/sensing device further including a sense transistor having a first conduction terminal coupled to said first conduction terminal of said switching/sensing device, a second conduction terminal coupled to said first sense terminal of said switching/sensing device, and a modulation terminal coupled to said modulation terminal of said switching/sensing device, and at least one main transistor, each said main transistor having a first conduction terminal coupled to said first conduction terminal of said switching/sensing device, a second conduction terminal coupled to said second sense terminal and said second conduction terminal of said switching/sensing device, and a modulation terminal coupled to said modulation terminal of said switching/sensing device;

said switching/sensing device responsive to a control signal coupled to said modulation terminal of said switching/sensing device for creating a conduction path between said first and second conduction terminals of said switching/sensing device if said control signal is in a first state and for preventing a conduction path between said first and second conduction terminals of said switching/sensing device if said control signal is in a second state, said control signal being in said first state when current is to be conducted from said second conduction terminal to said first conduction terminal and being in said second state at all other times; and means for generating said output signal, said means including a differential amplifier having an inverting input coupled to said first sense terminal, a non-inverting input coupled to said second sense terminal, and an output terminal, said differential amplifier powered by the potential difference between a predetermined one of said positive voltage supplies and said ground reference potential;

a feedback resistor having a first terminal coupled to said inverting input and a second terminal; and switch means having a first terminal coupled to the second terminal of said feedback resistor and a second terminal coupled to said differential amplifier output, said switch means responsive to said control signal for creating a conduction path between the terminals of said switch means if said control signal is in said first state and for preventing a conduction path between said terminals of switch means if said control signal is in said second state, the signal generated at said output terminal comprising said output signal.

20. The current sensing rectifier of claim 19 further comprising a hold capacitor having a first terminal coupled to said inverting input and a second terminal coupled to said differential amplifier output.

21. The current sensing rectifier of claim 19 wherein said switch means comprises a field effect transistor having a source terminal coupled to the second terminal of said feedback resistor, a drain terminal coupled to said differential amplifier output, and a gate terminal coupled to said control signal.

22. The current sensing rectifier of claim 19 wherein said switch means further comprises:

a bipolar junction transistor having an emitter terminal coupled to the second terminal of said feedback resistor, a collector terminal coupled to one of said positive voltage supplies, and a base terminal;

a rectifier having a cathode terminal coupled to said differential amplifier output and an anode terminal coupled to said base terminal; and a bias resistor having a first terminal coupled to said control signal and a second terminal coupled to said base terminal.

23. The current sensing rectifier of claim 22 wherein said switch means further comprises a capacitor having a first terminal coupled to said control signal of said switching/sensing device and a second terminal coupled to said base terminal.

24. The current sensing rectifier of claim 22 wherein said differential amplifier and said collector terminal are powered by the same positive voltage supply.

25. The current sensing rectifier of claim 22 wherein said differential amplifier and said collector terminal are powered by different positive voltage supplies.

26. The current sensing rectifier of claim 19 wherein said sense transistor of said switching/sensing device comprises a field effect transistor and wherein each said main transistor of said switching/sensing device comprises a field effect transistor.

27. A current sensing rectifier for rectifying the current in a selected branch of a circuit and for providing an output signal related to the magnitude of the rectified current in said branch, comprising:

a ground reference potential;

one or more positive voltage supplies for providing electrical power at a positive potential with respect to said ground reference potential;

a switching/sensing device including a first conduction terminal, a second conduction terminal, a modulation terminal, a first sense terminal, and a second sense terminal, said switching/sensing device coupled in series with said branch by means of said first and second conduction terminals, said switching/sensing device further including a sense transistor having a first conduction terminal coupled to said first conduction terminal of said switching/sensing device, a second conduction terminal coupled to said first sense terminal of said switching/sensing device, and a modulation terminal coupled to said modulation terminal of said switching/sensing device, and at least one main transistor, each said main transistor having a first conduction terminal coupled to said first conduction terminal of said switching/sensing device, a second conduction terminal coupled to said second sense terminal and said second conduction terminal of said switching/sensing device, and a modulation terminal coupled to said modulation terminal of said switching/sensing device;
a rectifier having an anode coupled to said ground reference potential and a cathode terminal;
a transformer having a first winding and a second winding, said secondary winding having a first terminal coupled to said first conduction terminal of said switching/sensing device and a second terminal coupled to said cathode terminal of said rectifier;
a buffer amplifier having an input terminal coupled to said cathode terminal of said rectifier and an output terminal coupled to said modulation terminal of said switching/sensing device, the output of said buffer amplifier comprising a control signal, said switching/sensing device acting in response to said control signal to create a conduction path between said first and second conduction terminals of said switching/sensing device when current is to be conducted from said second conduction terminal to said first conduction terminal and to prevent said conduction path at all other times; and
means for generating said output signal, said means including
a differential amplifier having an inverting input coupled to said first sense terminal, a non-inverting input coupled to said second sense terminal, and an output terminal, said differential amplifier powered by the potential difference between a predetermined one of said positive voltage supplies and said ground reference potential; and
a feedback resistor having a first terminal coupled to said inverting input and a second terminal coupled to said differential amplifier output terminal, the signal generated at said output terminal comprising said output signal.

* * * * *

UNITED STATES PATENT AND TRADEMARK OFFICE
CERTIFICATE OF CORRECTION

PATENT NO. : 5,097,403
DATED : March 17, 1992
INVENTOR(S) : David A. Smith It is certified that error appears in the above-identified patent and that said Letters Patent is hereby corrected as shown below:

In the Assignee section on the title page of the patent, "Rep. of Korea" should be deleted, and replaced with —Hong Kong—.

In column 1, line 58, "though" should be —through—.

In column 7, line 48, after "coupled" insert —to—.

In column 9, line 13, after "155" insert —, which is—.

In column 16, line 8, "FIG. 8" should be —FIG. 9—.

In column 19, line 9, "601" should be —606—.

Signed and Sealed this

Second Day of November, 1993

BRUCE LEHMAN

*Attest:*

*Attesting Officer*    *Commissioner of Patents and Trademarks*